United States Patent [19]

Kangas et al.

[11] Patent Number: 5,635,331
[45] Date of Patent: Jun. 3, 1997

[54] SUBSTRATE AND A COLOR PROOFING ARTICLE HAVING RELEASE AGENT/ ADHESIVE MIXTURE COATED THEREON

[75] Inventors: Steven L. Kangas, Woodbury; Charles W. Graves, Lake Elmo; Ramesh C. Kumar, Maplewood, all of Minn.

[73] Assignee: Minnesota Mining and Manufacturing Company, St. Paul, Minn.

[21] Appl. No.: 322,588

[22] Filed: Oct. 13, 1994

[51] Int. Cl.$^6$ .......................... G03C 1/805; G03C 11/12; G03C 5/18
[52] U.S. Cl. .......................... 430/260; 430/143; 430/257; 430/262; 430/263; 428/449; 428/40.7
[58] Field of Search .......................... 430/263, 262, 430/260, 257, 143; 428/40, 449

[56] References Cited

U.S. PATENT DOCUMENTS

| | | | |
|---|---|---|---|
| 3,011,988 | 12/1961 | Luedke et al. | 260/29.6 |
| 3,136,637 | 6/1964 | Larson | 96/75 |
| 3,318,852 | 5/1967 | Dixon | 260/78.5 |
| 3,671,236 | 6/1972 | Van Beusekom | 96/15 |
| 4,260,673 | 4/1981 | Kech | 430/143 |
| 4,885,225 | 12/1989 | Heller et al. | 430/160 |
| 4,999,266 | 3/1991 | Platzer et al. | 430/14 |
| 5,032,460 | 7/1991 | Kantner et al. | 428/449 |
| 5,154,962 | 10/1992 | Mertens et al. | 428/40 |
| 5,229,179 | 7/1993 | Kumar et al. | 428/40 |
| 5,232,814 | 8/1993 | Graves et al. | 430/158 |
| 5,248,583 | 9/1993 | Lundquist et al. | 430/263 |
| 5,492,791 | 2/1996 | Maerz et al. | 430/260 |

FOREIGN PATENT DOCUMENTS

4243253A1  6/1994  Germany.

*Primary Examiner*—John S. Chu
*Attorney, Agent, or Firm*—Gary L. Griswold; Walter N. Kirn; Susan Moeller Zerull

[57] ABSTRACT

Blocking is substantially reduced between individual sheets having a thermal adhesive coated thereon by including a release agent with the thermal adhesive. Preferred release agents are materials which have previously been used as low-adhesion backsize (LAB) coatings in pressure-sensitive adhesive applications.

26 Claims, No Drawings

SUBSTRATE AND A COLOR PROOFING ARTICLE HAVING RELEASE AGENT/ADHESIVE MIXTURE COATED THEREON

FIELD OF THE INVENTION

The present invention relates to color proofing films and, more particularly, those which have a decreased tendency for blocking when stacked.

BACKGROUND OF THE INVENTION

In the graphic arts, it is desirable to produce a color proof to assist a printer in correcting a set of photomasks which will be used in exposing printing plates. The proof should reproduce the color quality that will be obtained during the printing process. The proof must be a consistent duplicate of the desired half-tone or line image, and should neither gain nor lose color. Visual examination of a color proof should reveal the following characteristics:

1. Any defects on the photomask.
2. The best color rendition to be expected from press printing of the material.
3. The correct gradation of all colors and whether grays are neutral.
4. The need, if any, for subduing any of the colors and/or giving directions for altering the film photomask before making the printing plates.

Color proofing sheets for multicolored printing have heretofore been made by using a printing press proof which requires taking all the steps necessary for actual multicolor printing. Such a conventional method of color proofing has been costly and time consuming. Color proofing methods have therefore been developed to simulate the quality of press proofs.

An exemplary color proofing system is disclosed in U.S. Pat. No. 5,248,583, the disclosure of which is incorporated herein by reference. This patent provides a negative-acting color proofing photosensitive element comprising, in order (a) a carrier support, (b) a release layer which also acts as an oxygen barrier, (c) a photosensitive color layer containing a photopolymerizable multifunctional acrylate oligomer, (d) a photopolymerizable barrier layer and (e) a thermal adhesive.

A multicolored image on a single substrate can be obtained by performing the following procedure using the aforesaid photosensitive color proofing element:

(i) laminating a presensitized, photosensitive color proofing element with heat and pressure via the thermal adhesive to a developer-resistant receiver sheet;

(ii) removing the carrier support;

(iii) exposing the color proofing element through a color separation negative corresponding to the pigment of the color layer to actinic radiation to cross-link the exposed areas of the color proofing element and rendering the color and barrier layers insoluble in an aqueous alkaline developing medium to create a latent image;

(iv) developing the latent image with an aqueous alkaline developing medium whereby unexposed color and barrier layers are removed and exposed color and barrier layers remain;

(v) laminating an additional color proofing element having a different color pigment in the photosensitive color layer to the developed first color proofing element;

(vi) repeating steps (ii)–(iv) with a subsequent separation negative being in register with the developed first color proofing element; and (vii) repeating steps (v) and (ii)–(iv) in that order with additional color proofing elements as described above, each of the color proofing elements being of a different color, to provide a multicolored image on a single substrate.

A positive-acting color proofing system is disclosed in U.S. Pat. No. 4,260,673, the disclosure of which is incorporated herein by reference. This patent describes a presensitized color proofing element which includes a carrier sheet having a smooth release surface. Coated onto the release surface of the carrier sheet in a clinging engagement is a color coating of a mixture of a diazo oxide and a pigmented base-soluble resin compound. Bonded to the top of this color coating is a discrete binder layer of a mixture of a base-soluble resin and a diazo oxide. Both the binder layer and the color coating are solubilizable in a solvent developing medium upon exposure to actinic radiation. Firmly attached to the binder is a clear barrier layer which is insolubilizable in the development medium.

In order to obtain a multi-colored color proof on one substrate, the barrier layer of a first proofing element of the aforementioned construction is bonded to a substrate and the carrier sheet removed. The substrate with the presensitized proofing sheet bonded thereto is then exposed to actinic radiation through a color separation positive corresponding to the pigment of the color coating. The exposed diazo oxide and resin mixture in the binder layer and the color coating is rendered soluble to a solvent developing medium to create a latent image.

The latent image may then be developed with a solvent developing medium whereby the exposed diazo oxide and resin mixture in the binder layer and associated color coating is removed leaving the unexposed diazo oxide and resin. This process is repeated in sequence and in register so that the composite proof contains colored layers representing the magenta, cyan, yellow, and black contributions of the original subject matter.

A problem which is common to all sheet materials having a thermal adhesive on at least one surface is blocking. Blocking is a condition where separate sheets of material have become fused together to the point where the act of separating the sheets results in damage to any portion of the sheet. Such undesirable adhesion between touching sheets typically occurs under moderate pressure and at elevated temperature during storage. There is often impairment of the adhesive or the contacted surface when an attempt is made to separate members that have bonded.

Color proofing elements typically have a thermal adhesive on at least one surface and are stacked during storage. Thus, blocking can be a major problem. It has been conventional practice to add antiblocking agents to adhesive layers, and in some instances to the opposed surfaces. Typical antiblocking agents include particulates (e.g., silica or polymethylmethacrylate), and soluble organic materials that dissolve in the adhesive. Generally, the effectiveness of particulate antiblocking agents is directly proportional to the size of the particles and to the number of particles per unit area. However, large particles can be forced into previously-coated lower layers during lamination, including the color layer, thereby causing color-voids to appear in the final proof. In addition, high particulate concentrations cause haze to appear in the proofing element itself and in the final proof.

Soluble antiblocking agents often do not coat out well in certain adhesives and can solubilize important ingredients in adjacent layers. This last problem is particularly damaging in imageable layers with critical sensitometric and color balance problems such as those in prepress color proofing elements.

Another solution to the problem of blocking in color proofing elements is the use of thermal adhesives which have higher glass transition temperatures ("Tg"), i.e., greater than about 50° C. However, a key requirement of the adhesive is that during lamination, the adhesive must flow into the imaged relief of the color image that it's being laminated to. Incomplete flow into the relief results in entrapped air bubbles (referred to as microbubbles). The presence of larger microbubbles detracts from the appearance of the final proof. To minimize the size of the microbubbles, the adhesive must have good melt flow properties under laminating conditions. Under typical laminating conditions, good melt flow properties will occur if the Tg of the thermal adhesive is less than 50° C., preferably less than 40° C. Adhesives having such low glass transition temperatures, however, are more likely to cause blocking than adhesives with higher glass transition temperatures.

Accordingly, it would be desirable to use a thermal adhesive with as low a Tg as possible while avoiding the effect of blocking between individual color proofing sheets.

SUMMARY OF THE INVENTION

In accordance with the present invention, blocking is substantially reduced between individual sheets having a thermal adhesive coated thereon by including a release agent with the thermal adhesive. Preferred release agents are materials which have previously been used as low-adhesion backsize (LAB) coatings in pressure-sensitive adhesive applications.

In one embodiment, the present invention provides a coated substrate having a coating thereon which comprises a mixture of:

a) a thermal adhesive having a glass transition temperature ranging from about -10 to about 60° C.; and b) a release agent selected from the group consisting of (1) copolymers having at least one vinyl polymeric segment and at least one siloxane polymeric segment; (2) copolymers having an acrylic acid ester of an alkyl-terminated alcohol wherein the terminal alkyl chain is from 12 to 24 carbon atoms in length; and (3) copolymers derived from ethylenically-unsaturated fluoroalkyl-containing monomers.

The preferred release agent is (2) above wherein the acrylic acid ester of a long chain alkyl-terminated alcohol is present in the copolymer from 25 to 65 percent by weight; the acrylic acid is present in the copolymer from 3 to 15 percent by weight; the acrylic acid nitrile is present in the copolymer from 10 to 35 percent by weight; and the acrylic acid ester of a methyl, ethyl, or cyclohexyl alcohol is present in the copolymer from 0 to 40 percent by weight. Preferred monomers include octadecylacrylate, acrylic acid, acrylonitrile, and methylacrylate.

The thermal adhesive preferably has a glass transition temperature ranging from about 20° to about 40° C. and is selected from the group consisting of acrylic copolymers, vinyl/acrylic copolymers, polyvinylidene chloride copolymers, polyesters, polyurethanes, and rubber resins. The most preferred thermal adhesives are acrylic copolymers.

The release agent is preferably present in the coating at a weight percentage ranging from 0.1 to 30 and, more preferably, from 0.5 to 10 weight percent. To further reduce blocking, the coating may further include particulate matter such as, e.g., beads of polymethyl methacrylate.

Another embodiment of the present invention provides a color proofing article comprising, in the following order:

a) a carrier layer;

b) a color layer; and c) an adhesive layer comprising a thermal adhesive and a release agent, wherein the thermal adhesive and release agent are described above.

In one type of color proofing article, the color layer is photosensitive and may either be negative-acting or positive-acting. That is, the photosensitive color layer may include either a negative-acting photopolymerizable composition or a positive-acting photosensitive composition. This color proofing article may optionally include a barrier layer positioned between the color layer and the adhesive layer and/or a release layer positioned between the carrier layer and the color layer. As a further option, the barrier layer may be photosensitive. In this instance, the barrier layer would either be negative-acting or positive-acting in accordance with the color layer.

In another type of color proofing article, the color layer is non-photosensitive but the article includes a photosensitive sensitizer layer positioned between the color layer and the adhesive layer. The photosensitive sensitizer layer may be either positive-acting or negative-acting. Optionally, this color proofing article may include a release layer positioned between the carrier layer and the color layer and/or a barrier layer positioned between the sensitizer layer and the adhesive layer.

DETAILED DESCRIPTION OF THE INVENTION

In a preferred embodiment, the present invention provides a photosensitive color proofing element which comprises a carrier having an optional release surface, and when the photosensitive composition is sensitive to oxygen, the release surface is a coated layer which preferably performs both as a releasing agent and oxygen barrier; a photosensitive color layer containing, e.g., a negative-acting photopolymerizable composition such as a photo-oligomer on the release surface; optionally, a barrier layer on the colored photosensitive layer such as a photosensitive, e.g., photopolymerizable, barrier layer; and an adhesive layer containing a thermal adhesive and a release agent on the barrier layer.

The photosensitive color proofing element may also be positive-acting. In this case, the photosensitive color and barrier layers contain a positive-acting, e.g., diazo oxide which becomes soluble in a solvent developing medium when exposed to actinic radiation.

As an alternative to the foregoing, the color proofing element may have a non-photosensitive color layer and a photosensitive sensitizer layer positioned between the color layer and adhesive layer. The sensitizer layer may be either positive-acting or negative-acting. In the case of a negative-acting sensitizer layer, e.g., a light-sensitive diazo resin, the sensitizer layer becomes insolubilized from its initial state upon exposure to actinic radiation. In this manner, the color layer and sensitizer layer would remain on the carrier in the imaged areas after development while the non-imaged portions of the color and sensitizer layers would be removed during development.

A negative-acting color proofing element with a photosensitive color and barrier layer is preferred. Such a proofing element will now be described in greater detail.

Preferably, the carrier is composed of a dimensionally and chemically stable base material. One preferred material for use in the present invention is a polyester film (e.g. polyethylene terephthalate or polyethylene naphthalate) which may have a smooth or textured (matte) surface. Other materials which may be used include cellulose triacetates, polycarbonates, and other transparent polymeric materials.

The carrier may optionally have a release surface whose function is to serve as a parting layer between the carrier sheet and the photosensitive color layer. If the photosensitive color layer is sensitive to oxygen quenching during the exposure process, then an oxygen barrier may be necessary. This oxygen barrier can function as both a barrier for oxygen and as a release layer. The oxygen barrier/release layer releases from the carrier and clings to the photosensitive color layer after lamination to a receiver and subsequent removal of the carrier. The release layer can be coated onto the carrier using an aqueous solution of water soluble resins. Preferred water soluble resins non-exclusively include alkyl ethers of cellulose, polyvinyl alcohols and polyvinyl pyrrolidone. The release properties of the layer can be controlled by the incorporation of a water soluble surfactant. Preferred surfactants non-exclusively include alkylarylpolyether alcohols, glycerin and ethoxylated castor oil. Preferably, the surfactant is present in the release layer in the amount of 0.1–10% by weight of solids in the layer, more preferably 0.5–7%. Other ingredients may be added such as mold inhibitors, anti-halation dyes, filter dyes, solvents, wetting agents, etc.

Adjacent to the release layer is coated the photosensitive color layer which typically comprises a photopolymerizable oligomer, colorant, initiator system, binders and other optional components such as wetting agents, surfactants, coating rheology modifiers, optical brighteners, plasticizers, residual solvents, etc. The photosensitive color layer is coated onto the releasable surface of the carrier using a mixture of solvents which give rise to the best coating quality and solution stability. Representative solvents include ketones, alkyl ethers or acetates of propylene glycol, alkyl ethers or acetates of ethylene glycol, dioxolane, butyrolactone, and alcohols.

The photopolymerizable oligomer preferably comprises a multifunctional acrylate whose function is to form a high molecular weight polymer upon initiation by light generated radicals. The molecular weight of the acrylated oligomer influences several performance characteristics of the final coated film such as the tack of the coated film, the strength of the developer necessary to develop the image and the quality of the image attained. If the film imparts too much tack then it is difficult to manufacture the material in a production coating process without disruption of the film. This would give rise to poor coating quality. The strength of the developer required to develop the image is directly proportional to the molecular weight of the oligomer and the acid content of oligomer. Oligomers with lower molecular weights and high acid content are easier to develop and therefore do not need very aggressive developers. However, too much acid content or too high a molecular weight can cause destabilization of the pigment dispersions when acidic binders are used to disperse the pigments. When a low molecular weight oligomer is incorporated into the photosensitive color layer, the developability is increased so that a photosensitive barrier is not necessary; however, the tack of this film is very high, thus making the film impractical to coat on most production coaters. Suitable photopolymerizable oligomers are disclosed in U.S. Pat. No. 5,248,583, the disclosure of which is incorporated herein by reference. For example, compositions of acrylated epoxy oligomers can be altered to achieve a balance between tack, developability and solution stability through the molecular weight of the material and the acid/amine content of the material. The preferred acrylated epoxy oligomer to achieve a coating which has acceptable tack has a mean molecular weight range of 2,400 to 5,000 and more preferably in the range of 2,400 to 3,500; and is present in the composition in the amount of 45–70% by weight (more preferably in the amount of 50–65%). Other acrylated oligomers which have shown utility include urethane oligomers as described in U.S. Pat. No. 4,304,923. The preferred acrylated urethane oligomers to achieve a coating which has acceptable tack has a mean molecular weight range of 2,500 to 7,500 and more preferably in the range of 3,000 to 5,000; and is present in the composition in the amount of 45–70% by weight.

Preferably, the photoinitiator(s) used must not generate a visible color change in the image or adhesive layers after exposure. Examples of photoinitiators non-exclusively include triazines, acetophenones, benzophenones, and thioxanthones. The preferred photoinitiators include Irgacure™ 907(2-methyl-1-(4-methylthio)phenyl)-2-(4-morpholinyl)-1-propane) from Ciba Geigy, Irgacure™ 369 from Ciba Geigy, Quantacure™ ITX(isopropyl-thioxanthone) from Biddle Sawyer, and triazines tethered to alkylarylpolyether alcohols as dislosed in U.S. Pat. No. 5,298,361. Photoinitiators are preferably present in the composition in the amount of 1.0–15% by weight. The optimum amount of initiator will be dependent upon the oligomer type used and the filtering effect of the pigment used.

Pigments or dyes may be used as colorants in the photosensitive color layer; however, pigments are preferred since they have a lower tendency for migration between the layers. The pigments are generally introduced into the photosensitive formulation in the form of a millbase comprising the pigment dispersed with a binder and suspended into a solvent or mixture of solvents. Many different pigments are available and are well known in the art. The pigment type and color are chosen such that the coated colored element is matched to a preset color target or specification set by the industry. Other colorants useful in the invention include fluorescent and metallic materials as mentioned in "Paint and Surface Coatings: Theory and Practice," R. Lanbourne, Editor, Hasted Press, 1967, pages 183 to 185. These colorants can be used either alone or in combination with the above pigments to produce proofs when these effects are desired. The type of dispersing resin and the pigment to resin composition ratio chosen are dependent upon the pigment type, surface treatment on the pigment, dispersing solvent and milling process. Some examples of resins suitable for generating millbases which are compatible with the aforementioned photo-oligomers non-exclusively include polyvinyl acetate/crotonic acid copolymers, styrene maleic anhydride half esters resins, acrylic and methacrylic polymers and copolymers, polyvinyl acetals, polyvinyl acetals modified with anhydrides and amines, hydroxy alkyl cellulose resins and styrene acrylic resins. The primary composition of the dispersing resin is an acidic resin; however, some non-acidic resins may be present. In some combinations a dispersing agent may be necessary to achieve optimum dispersion quality. Some examples of dispersing agents non-exclusively include polyester/polyamine copolymers, Disperse Aids™ from Daniels, PKE 1370 polyester resin from Biddle Sawyer, alkylarylpolyether alcohols, and acrylic resins. Other components may also be included in the millbase such as surfactants to improve solution stability, fluorescent materials, optical brighteners, UV absorbers, fillers, etc. The preferred composition of millbase solids comprises 30–71% by weight pigment, 15–30% by weight acidic resin, 0–25% non-acidic resin, and 0–20%, more preferably 0–10% dispersing agents.

Additional binders may also be included in the photosensitive color formulation to balance developability and tack. Some examples of additional binders which are compatible with the aforementioned photo-oligomers and millbases non-exclusively include polyvinyl acetate/crotonic acid copolymers, styrene maleic anhydride half esters resins, acrylic and methacrylic polymers and copolymers, polyvinyl acetals, polyvinyl acetals modified with anhydrides and amines, and styrene acrylic resins. In the preferred composition of the photosensitive color layer, the pigment is present in the amount of 5–20% by weight, the acidic resin in the amount of 10–20% by weight and non-acidic resin in the amount of 0–5% by weight.

Coated adjacent to the photosensitive color layer is the photosensitive, e.g., photopolymerizable, barrier layer. The barrier layer is present to prevent interaction between the color layer and adhesive, and improves developability of the non-image areas. As previously discussed, this layer may be optional if the photosensitive color layer contains a photo-oligomer system which is low in molecular weight and has high developability. However, when photo-oligomer systems are used which reduce the tack of the color layer, the optimum performance of the element can be achieved if the photopolymerizable barrier is incorporated into the construction. The composition of the photo-polymerizable barrier layer preferably comprises an ethylenically unsaturated compound which can form a higher molecular weight polymer upon photochemical radical initiation, an acidic binder and a photoinitiator. Preferred examples of ethylenically unsaturated compounds non-exclusively include acrylated epoxy oligomers, acrylated urethane oligomers as described in U.S. Pat. No. 4,304,923, Echo Resin™ TAE 310 (Triacrylated aromatic epoxide) and Dynacoll™ A 6083 (acrylated copolyester available from Huls), and are present in the composition in the amount of 50–65%. Preferred binders non-exclusively include polyvinyl acetate/crotonic acid copolymers, styrene maleic anhydride half esters resins, acrylic and methacrylic polymers and copolymers, acidified polyvinyl acetals, and styrene acrylic resins and are present in the composition in the amount of 30–50%. Preferred photoinitiators non-exclusively include Irgacure™ 907, Quantacure™ ITX (isopropylthioxthone) and triazines tethered to alkylarylpolyether alcohols, and are present in the composition in the amount of 1–10% by weight. The coating weight is generally between 0.15 and 2.0 g/m², preferably between 0.2 and 1.0 g/m², dry weight of the entire layer. This is about 0.15 to 2.0 micrometers in thickness.

In the case of positive-acting systems, the light-sensitive material in the color and barrier layers is preferably a diazo oxide selected from the group of orthoquinone diazides, such as the naphthoquinone-(1,2)-diazido-(2)-5-sulfo-acid ester of 4-tertiary butylphenol.

Coated adjacent to the barrier is the adhesive layer. The adhesive layer contains a thermal adhesive and provides a means of laminating the element to a substrate under heat and pressure. In accordance with the present invention, the adhesive layer further includes a release agent to reduce or prevent blocking during storage. This allows a thermal adhesive to be used which has a low Tg, i.e., lower than 50° C. and, preferably, between 20° and 40° C. As will be discussed below, preferred release agents are materials which have previously been used as low-adhesion backsize (LAB) coatings.

Some examples of resins which may be used for the thermal adhesive include vinyl acetate polymers and copolymers; acrylic and methacrylic polymers, copolymers and terpolymers; polyvinyl acetals; acrylamide copolymers and terpolymers; polyurethanes; polyesters; and rubber-based resins to which an appropriate amount of tackifier has been added.

Preferred thermal adhesives are those having a Tg between about −10° and 60° C. and, preferably, between 20° and 40° C. Acrylic copolymers formed from, e.g., isooctyl acrylate, ethyl acrylate, methyl acrylate, 2-ethyl hexyl acrylate, methyl methacrylate, butyl acrylate, acrylic acid, and n-methylol acrylamide monomers, are particularly preferred. Examples of such acrylic copolymers non-exclusively include Reichhold 40440 and Reichhold 97603 (terpolymer of N-(hydroxymethyl) acrylamide/butyl acrylate/methyl methacrylate).

As noted above, the preferred release agent is selected from a class of materials which have previously been used as low-adhesion backsize (LAB) coatings. Such LAB materials are well known in the field of pressure-sensitive adhesives. Products having pressure-sensitive adhesives typically feature a sheet backing coated on one side with an adhesive that adheres to a wide variety of surfaces upon the application of pressure alone. Such products are often sold in roll form. To permit the roll to be unwound without the undesirable transfer of adhesive to the other side of the backing, it is customary to provide that surface with a low adhesion backsize (LAB), to which the pressure-sensitive adhesive bonds less firmly. In this regard, LAB materials are expected to provide an appropriate level of release from the adhesive of interest and to not deleteriously affect the adhesive.

A number of different LAB materials exist. Examples include long chain linear and branched hydrocarbon polymers such as acrylate, methacrylate, vinyl ester, and vinyl carbamate polymers as well as copolymers thereof; fluorocarbon copolymers; and silicones including silicones modified with epoxy groups or co-cured with isocyanates, polybutadiene, acrylic emulsions, etc.

It has been discovered that when certain classes of LAB materials are blended with a thermal adhesive, the problem of blocking is substantially minimized without adversely affecting the adhesion of the adhesive layer to a color-proofing receiver sheet after lamination. In the color proofing element of the present invention, the LAB material which is blended with the thermal adhesive layer is preferably selected from among the materials described in U.S. Pat. Nos. 5,032,460, 5,154,962, 3,318,852, and 3,011,988, the disclosures of which are incorporated herein by reference.

U.S. Pat. No. 5,032,460 describes the use of vinyl/silicone copolymers as an LAB material. The preparation thereof involves the use of mercapto-functional silicone as a macromolecular chain transfer agent. This method results in silicone as the backbone and (meth)acrylates as pendant groups with the copolymer. The copolymer prepared by this method is represented by the following general formula:

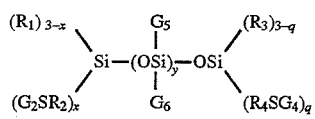

wherein

R₁ are monovalent moieties which can independently be the same or different and are selected from the group consisting of alkyl, aryl, alkaryl, alkoxy, alkylamino, hydroxyl, hydrogen, and fluoroalkyl;

R₂ can independently be the same or different and are divalent linking groups;

$R_3$ are monovalent moieties which can independently be the same or different and are selected from the group consisting of alkyl, aryl, alkaryl, alkoxy, alkylamino, hydroxyl, hydrogen and fluoroalkyl;

$R_4$ can be independently be the same or different and are divalent linking groups;

$G_5$ are monovalent moieties which can independently be the same or different and are selected from the group consisting of alkyl, aryl, alkaryl, alkoxy, alkylamino, fluoroalkyl, hydrogen, and —ZSA;

Z is a divalent linking group;

A is a vinyl polymeric segment consisting essentially of polymerized free radically polymerizable monomer;

$G_6$ are monovalent moieties which can independently be the same or different and are selected from the group consisting of alkyl, aryl, alkaryl, alkoxy, alkylamino, fluoroalkyl, hydrogen, and —ZSA;

$G_2$ comprises A;

$G_4$ comprises A;

x is an integer of 0–3;

y is an integer of 10 or greater; and q is an integer of 0–3.

U.S. Pat. No. 5,154,962 describes an LAB material which is based on a copolymer made of A, B, and C monomers, wherein:

A is at least one free radically polymerizable vinyl monomer;

B is at least one polar monomer copolymerizable with A, the amount of B being of up to 30% of the total weight of all monomers, and C is a monomer having the general formula
X—(Y)$_n$—SiR$_{(3-M)}$Z$_m$ wherein
X is a vinyl group copolymerizable with the A and B monomers Y is a divalent linking group where n is zero or 1;

m is an integer of from 1 to 3;

R is hydrogen, lower alkyl (e.g., methyl ethyl, or propyl), aryl (e.g., phenyl or substituted phenyl), or alkoxy; and Z is a monovalent siloxane polymeric moiety having a number average molecular weight above about 1,000 and is essentially unreactive under copolymerization conditions.

U.S. Pat. No. 3,318,852 describes release agents which are composed of copolymers derived from ethylenically-unsaturated fluoroalkyl-containing monomers.

The release agent which is most preferred is disclosed in U.S. Pat. No. 3,011,988. This patent describes acrylic tetrapolymers formed by the copolymerization, in percent by weight, of (1) from about 25 to about 65% of an acrylic acid ester of a long-chain alkyl-terminated alcohol wherein the terminal alkyl chain is from at least 12 to about 24 carbon atoms in length, (2) about 3 to about 15% of an acrylic acid, (3) about 10 to about 35% of an acrylic acid nitrile, and (4) 0 to about 40% of a compound selected from the group consisting of an acrylic acid ester of a methyl, ethyl or cyclohexyl alcohol.

The release agent may be present in the adhesive layer in any desired amount but preferably ranges from 0.01 to 30% by weight and, more preferably, from 0.1 to 5% by weight.

The solvent used to coat the adhesive layer must not attack or interact with the adjacent color layer. Examples of suitable solvents include water and hydrocarbon solvents. Polar solvents such as water are preferred.

The adhesive layer may have a dry coating weight ranging from about 25 to about 2000 mg/ft$^2$, preferably from about 100 to about 1000 mg/ft$^2$, and may be coated using any conventional coating method such as, e.g., extrusion bar coating, curtain coating, knife coating, gravure coating, etc.

Other additives may be present in the adhesive layer to aid in coating and performance such as surfactants, coalescence aids, plasticizers, polyethylene waxes, optical brighteners, UV absorbers, etc. In addition, particulate material such as, e.g., beads of polymethyl methacrylate (as described in U.S. Pat. No. 4,885,225), steryl methacrylate, silica, or glass, may be included in the adhesive layer to further reduce blocking. Because of the presence of the release agent in the adhesive layer, beads of smaller size and in lower concencentrations can be employed, thereby lessening or avoiding the aforementioned effects of color-voids and haze in the proof itself and in the final image. Preferably, the beads (particulates) have an average size which ranges from 6 to 18 micrometers and are present in the adhesive layer at a concentration ranging from 10 to 50 particulates/mm$^2$. The particulates are preferably added to the adhesive/release agent mixture before being coated onto a substrate.

The invention will now be further illustrated by the following non-limiting examples. All chemicals are commercially available unless otherwise noted.

EXAMPLE 1

Preparation of MA/NVP/AA/SiMac LAB (45/35/5/30 parts by weight, respectively)

A 16-oz. amber glass reaction bottle was charged with 39.1 g of methylacrylate (MA), 30.4 g of N-vinyl pyrrolidone (NVP), 4.3 g of acrylic acid (AA), 26.1 g of 10,000 MW silicone macromer (SiMac), 0.25 g of 2,2'-azobisisobutyronitrile (AIBN) and 150 g of methyl ethyl ketone (MEK). The resulting mixture was purged with nitrogen for 2 minutes at 1 L/min., after which the bottle was sealed. The sealed bottle containing a clear solution was tumbled in a constant temperature bath for 24 hrs. at 55° C., resulting in a very viscous milky solution to which was added 35.7 g of methanol to reduce solids from 40% to 35%.

To obtain a waterborne solution of the above LAB material, a blender was charged with 315 g of deionized (DI) water, 1.2 g of 30% ammonium hydroxide, and 100 g of the above prepared solventborne LAB copolymer. The mixture was blended until the dispersion was homogeneous. The organic solvents were stripped off to give a 10% solids waterborne LAB solution.

EXAMPLE 2

Preparation of MA/NVP/AA/SiMac (45/35/5/10) LAB

The procedure of Example 1 was repeated. The charges of components were as follows: MA (47.4 g), NVP (36.8 g), AA (5.3 g), SiMac (10.5 g), AIBN (0.25 g), MEK (150 g) and methanol (37.5 g).

To obtain a waterborne solution of the above LAB material, the charges were as follows: DI water (315 g), ammonium hydroxide (1.55 g), and the above-described solventborne LAB copolymer (100 g).

EXAMPLE 3

Preparation of MA/NVP/AA/SiMac (45/35/5/5) LAB

The procedure of Example 1 was repeated. The charges of components were as follows: MA (50 g), NVP (38.9 g), AA (5.6 g), SiMac (5.6 g), AIBN (0.25 g), MEK (150 g) and methanol (35.7 g).

To obtain the waterborne solution of the above LAB copolymer, the charges were as follows: DI water (315 g), ammonium hydroxide (1.63 g), and the above-described solventborne LAB copolymer (100 g).

EXAMPLE 4

Preparation of ODA/MA/AN/AA (51/11/25/13) LAB

An amber-colored quart bottle was charged with 102 g of octadecylacrylate (ODA) (50% solids in ethyl acetate), MA (11 g), 25 g of acrylonitrile (AN), AA (13 g), AIBN (0.5 g) and 182 g of ethyl acetate. The resulting mixture was purged with nitrogen for 3 minutes at 1 L/min., after which the bottle was sealed. The sealed bottle containing the solution was tumbled in a constant temperature bath for 48 hrs. at 65° C.

To obtain a waterborne solution of the above LAB copolymer, 261 g of DI water, 3.1 g of ammonium hydroxide, and 100 g of the above-prepared solventborne LAB copolymer were homogenized in a suitable container and then the ethyl acetate was stripped off under vacuum to obtain a 10% solids solution in water.

EXAMPLE 5

Preparation of FX-14/MMA/KF-2001 (55/7/38) LAB

A 16-oz. reaction bottle was charged with 55 g of FX-14 (N-ethyl perfluorooctylsulfonamido ethyl methacrylate), 7 g of methyl methacrylate (MMA), 38 g of mercaptofunctional silicone (KF-2001), 0.25 g of AIBN, and 150 g of MEK. The resulting reaction mixture was purged with nitrogen for 2 minutes at 1 L/min., after which the bottle was sealed. The sealed bottle containing the clear solution was tumbled in a constant temperature bath for 48 hrs. at 55° C., giving a transparent viscous solution.

EXAMPLE 6

Preparation of MA/AA/KF-2001 (50/37.5/15) LAB

The procedure of Example 1 was repeated. The charges of the components were as follows: MA (48.8 g), AA (36.6 g), KF-2001 (14.6 g), AIBN (0.25 g), MEK (150.0 g), and 35.7 g Isopropyl Alcohol (IPA).

To obtain a waterborne solution of the above LAB copolymer, the charges were as follows: DI water (315 g), ammonium hydroxide (10.7 g) and above-mentioned solventborne LAB copolymer (100 g).

EXAMPLES 7–10

Preparation of MA/MMA/MAA/KF-2001 LAB Materials

The procedure of Example 1 was repeated. The charges of the components in grams were as follows:

| Monomers | Example 7 (g) | Example 8 (g) | Example 9 (g) | Example 10 (g) |
|---|---|---|---|---|
| MA | 18.2 | | 27.3 | 50.0 |
| MMA | 45.5 | 18.2 | 36.4 | 20.0 |
| MAA | 9.1 | 13.6 | 9.1 | 5.0 |
| KF-2001 | 27.3 | 22.7 | 27.3 | 25.0 |
| AIBN | 0.25 | 0.25 | 0.25 | 0.25 |
| MEK | 150 | 150 | 150 | 150 |
| To obtain waterborne dispersions of the LAB materials of Examples 7–10, the charges of the components were as follows (g) | | | | |
| Solventborne LAB copolymer | 100 | 100 | 100 | 100 |
| Ammonium hydroxide | 2.5 | 3.75 | 2.5 | 1.38 |
| DI water | 351 | 351 | 351 | 351 |

EXAMPLE 11

Blends of 40440 latex adhesive available from Reichhold Chemicals and a number of silicone-, fluorochemical-, and ODA(octadecylacrylate)-based LAB's listed in Table 1 were screened for compatibility and relative surface energy of the resultant coated films. Two LAB levels were prepared (based on solids): 75% adhesive and 25% LAB (75/25); and 98% adhesive and 2% LAB (98/2). Blends were prepared by adding the appropriate amount of LAB to the adhesive and mixing. Observations of the solution blends are shown in Table 1.

TABLE 1

| | LAB Composition | Observations | |
|---|---|---|---|
| Sample | (Parts by weight) | 75/25 | 98/2 |
| 1 | MA/NVP/AA/SiMac (45/35/5/5) | Paste/gel-like | Paste/gel-like |
| 2 | MA/NVP/AA/SiMac (45/35/5/10) | Paste/gel-like | Paste. Very viscous |
| 3 | MA/NVP/AA/SiMac (45/35/5/20) | Paste/gel-like | Paste. Very viscous |
| 4 | MA/NVP/AA/SiMac 45/35/5/40) | Paste/gel-like | Paste. Very viscous |
| 5 | MA/NVP/AA/SiMac (45/35/5/30) | Paste/gel-like | Paste. Very viscous |
| 6 | MA/AA/KF-2001 (50/37.5/15) | Coagulated Latex | Increased viscosity |
| 7 | MA/MMA/MAA/KF-2001 (50/20/5/25) | Paste/gel-like | No apparent change in viscosity |
| 8 | MA/MMA/MAA/KF-2001 | Paste/ | Paste/ |

TABLE 1-continued

| | LAB Composition | Observations | |
|---|---|---|---|
| Sample | (Parts by weight) | 75/25 | 98/2 |
| | (20/50/10/30) | gel-like | gel-like |
| 9 | MA/MMA/MAA/KF-2001 (30/40/10/30) | Paste/ gel-like | Paste/ gel-like |
| 10 | ODA/MA/AN/AA (51/11/25/13) | No apparent change in viscosity | No apparent change in viscosity |
| 11 | ODA/MA/MMA/AA (51/11/25/13) | No apparent change in viscosity | No apparent change in viscosity |
| 12 | ODA/MA/MMA/AA (70/11/25/3) | Paste-like | No apparent change in viscosity |
| 13 | FX-14/MMA/KF-2001 (55/7/38) | Coagulated latex (LAB in MEK) | No apparent change in viscosity |
| 14 | FC-824 | Paste/ gel-like | No apparent change in viscosity |
| 15 | MeFOSEA/styrene/MMA/AA (60/15/16/9) | Paste/ gel-like | No apparent change in viscosity |

"MA" is methylacrylate
"NVP" is N-vinyl pyrrolidone
"AA" is acrylic acid
"SiMac" is 10,000 MW silicone macromer
"KF-2001" is mercaptofunctional silicone
"MMA" is methyl methacrylate
"MAA" is methacrylic acid
"ODA" is octadecylacrylate
"AN" is acrylonitrile
"FX-14" is N-ethyl perfluorooctylsulfonamido ethyl methacrylate
"FC-824" is a perfluorinated polyester composition commercially available from 3M Co.
"MeFOSEA" is N-methyl perfluorooctylsulfonamido ethyl acrylate At 25% LAB all the silicone- and fluorochemical-based LABs caused de-stabilization of the latex, resulting in an essentially non-flowing paste/gel-like solution. Two of the ODA-based LABs have no apparent effect on the latex, but Sample 12 resulted in a paste-like blend. Both Samples 11 and 12 had a strong odor of ethylacetate (apparently not completely removed from the stripping process). The solvent is likely playing a role in the destabilization of Sample 12.

At 2% LAB the silicone-based LAB's were again paste-like. The fluorochemical-based LAB's appeared to blend without significant increase in viscosity. There was no apparent change in the viscosity of the ODA-based blends.

The 2% LAB/98% adhesive blends were coated on Polyethylene Terephthalate (PET) film and 180° peel force measurements with Magic™ tape were performed. The blends were coated at ~35% solids with a #10 Mayer rod and dried for 2.5 min. at 180° F. The silicone-based LAB blends were diluted to 25% solids to get a coatable solution. Even at 25%, the silicone-based blends were still viscous and paste-like. Visual observations of the blend coatings were made. The SiMAC-based blends were all clear. The ODA-based blends were clear. Samples 11 and 12 had severe orange peel-like pattern, likely due to residual solvent. Samples 8 and 9 were cloudy and contained a lot of gel particles. The fluorochemical-based blends were clear. Coatings with 25% FC-824 contained a lot of gel-like particles. Peel force results are shown in Table 2.

TABLE 2

| Sample | 180° peel force-Magic ™ Tape (g/0.75 in.) |
|---|---|
| Control (No LAB) | 91 |
| 1 | 86 |
| 2 | 83 |
| 3 | 91 |
| 4 | 85 |
| 5 | 84 |
| 6 | 76 |
| 7 | 78 |
| 8 | — |
| 9 | 76 |
| 10 | 8 |
| 11 | 32 |
| 12 | 24 |
| 13 | 81 |
| 14 | 68 |
| 15 | 50 |

Only the ODA-based LAB's were effective at significantly lowering the surface energy of 40440 at low (2%) LAB levels. The silicone- and fluorochemical-based LAB's were all but ineffective at reducing surface energy at the 2% level.

40440/Sample 10 LAB blends appear compatible over the whole range of compositions (from 0–100% LAB). The term compatible is used here to mean that the blends give optically clear films upon drying. Although the films are clear it appears that the blends are not miscible; scanning electron microscopy (SEM) of cross-sections of a dried film of a 40440/Sample 10 (90/10) blend shows a spherical dispersed phase of the LAB in the 40440 matrix. The size of the dispersed phase is about 500 angstroms.

180° peel tests were performed on a range of 40440/Sample 10 blends. The results are shown in Table 3.

TABLE 3

| 180° Peel Force- Magic ™ Tape (g/0.75 in.) | Weight % of LAB in Blend |
|---|---|
| 115 | 0 |
| 95 | 0.5 |
| 80 | 1.0 |
| 47 | 2.0 |
| 32 | 5 |
| 24 | 10 |
| 5 | 100 |

It appears that very little LAB is required to significantly lower the surface energy of the adhesive. The addition of 2% LAB to 40440 results in a decrease in peel force of over 50% compared to the 40440 control (i.e., 0% LAB). This non-linear relationship between relative surface energy and LAB content suggests that the LAB migrates to the surface of the adhesive coating during the drying process (the mechanism similar to the migration of a surfactant to the surface of a polymer coating), the driving force being the reduction in surface energy. Higher concentration of the LAB at the film surface relative to the bulk has been confirmed by attenuated total reflectance Fourier transform spectroscopy.

EXAMPLE 12

A number of blends of 40440 latex adhesive with ODA/MA/AN/AA LAB were prepared and coated. The composition of the LAB was that of Sample 10 in Table 1. The blends were coated on a Matchprint™ III cyan color proofing film, commercially available from 3M Co. Table 4 shows the blend formulations and Table 5 shows the run conditions.

TABLE 4

| Wt. Ratio | Formulation (parts by weight) | | | |
|---|---|---|---|---|
| Adhesive/ LAB | Latex Adhesive | LAB | Surfynol SE-F | Water |
| 100/0 | 99.7 | 0 | 0.1 | 0.17 |
| 98/2 | 92.4 | 7.1 | 0.1 | 0.34 |
| 95/5 | 83.1 | 16.5 | 0.1 | 0.34 |
| 90/10 | 70.1 | 29.4 | 0.1 | 0.34 |
| 80/20 | 51.2 | 48.3 | 0.1 | 0.34 |
| 75/25 | 44.1 | 55.5 | 0.1 | 0.35 |
| 50/50 | 20.8 | 78.6 | 0.1 | 0.44 |
| 25/75 | 8.2 | 91.3 | 0.1 | 0.35 |
| 0/100 | 0 | 99.3 | 0.1 | 0.62 |

40440 Adhesive @ 37% solids (Reichhold Chemicals)
ODA/MA/AN/AA (51/11/25/13) LAB @ 9.8% solids (sample 10, Table 1)
Surfynol SE-F (a surfactant from Air Products) @ 100% solids

TABLE 5

| Sample | Adhesive/ LAB | Oven Temperature | | Web Speed (Ft/min.) | Bead* #/sq. mm | Coating Weight |
|---|---|---|---|---|---|---|
| | | Top | Bottom | | | |
| 1 | 0/100 | 200° F. | 140° F. | 40 | 5 | 500 mg/sq ft. |
| 2 | 25/75 | 200° F. | 140° F. | 50 | 28 | 500 mg/sq ft. |
| 3 | 50/50 | 200° F. | 140° F. | 60 | 24 | 500 mg/sq ft. |
| 4 | 75/25 | 200° F. | 140° F. | 70 | 27 | 500 mg/sq ft. |
| 5 | 100/0 | 200° F. | 140° F. | 70 | 35 | 500 mg/sq ft. |
| 6 | 80/20 | 200° F. | 140° F. | 70 | 35 | 700 mg/sq ft. |
| 7 | 90/10 | 200° F. | 140° F. | 70 | 37 | 700 mg/sq ft. |
| 8 | 95/5 | 200° F. | 140° F. | 70 | 38 | 700 mg/sq ft. |
| 9 | 98/2 | 200° F. | 140° F. | 70 | 42 | 700 mg/sq ft. |
| 10 | 100/0 | 200° F. | 140° F. | 70 | 48 | 700 mg/sq ft. |

*10.5 μm PMMA (Polymethylmethacrylate) beads; In-line bead mixing.

The coated constructions were evaluated for laminator roll wrap by first laminating a sheet of the coated material to Matchprint™ III commercial base using a 3M model MR 447 laminator. The color/barrier was processed off leaving the adhesive on the base. A 3"×8" sample of the adhesive coated base was cut and run through the laminator adhesive side up under standard conditions (upper roll 280° F.; lower roll 180° F., 50 in/min.). The samples were observed as they came through the rollers for their tendency to wrap/stick to the upper rubber roller. Results are shown in Table 6.

TABLE 6

| Sample | Adhesive/LAB | Observations |
|---|---|---|
| 1 | 0/100 | No wrapping/sticking over entire sheet. |
| 2 | 25/75 | No wrapping at lead edge. Begins to wrap at tail end of sheet. |
| 3 | 50/50 | No wrapping at lead edge. Begins to stick ~½ way through sheet. |
| 4 | 75/25 | No wrapping at lead edge. Begins to stick ~⅓ way through sheet. |
| 5 | 100/0 | Entire sample wrapped tightly to roll |
| 6 | 80/20 | Slight wrap at lead edge. |
| 7 | 90/10 | Slight wrap at lead edge. |
| 8 | 95/5 | Tightly wrapped at lead edge. |
| 9 | 98/2 | Tightly wrapped at lead edge. |

Incorporation of the ODA/MA/AN/AA LAB into the adhesive at levels greater than 25% leads to a pronounced reduction in the tendency of the adhesive to adhere to the laminator roller. At levels below 25% the LAB has little to no impact on roll wrap.

Blocking was evaluated on film samples 6–9. During this run adhesive/LAB was coated at 700 mg/sq.ft with 10.5 μm PMMA beads (35–40 beads/sq. mm). At this coating weight the blocking performance of the 40440 control (i.e., no LAB) was quite poor. To perform the blocking test, 4"×8" sheets of LAB/adhesive blends coated on color proofing elements were cut and stacked. A 4"×8" piece of 3/16" plate glass was placed over the sheets. This provides a pressure of 8 g/sq. in. on the sheets.

The sheets were then placed in an oven at 60° C. for 24 hrs. at ambient humidity. To evaluate blocking, the sheets were peeled apart and blocking was rated on a 0– 6 KRAL scale where 0=no sticking between sheets (sheets slide freely over each other); 1=slight sticking, but no color transfer; and 6=essentially all color transfers to the backside of the PET.

The blocking results are shown in Table 7.

TABLE 7

| Sample | Adhesive/LAB | Blocking (KRAL) |
|---|---|---|
| (control) | 100/0 | 5.2 |
| 6 | 80/20 | 0.5 |
| 7 | 90/10 | 1.3 |
| 8 | 95/5 | 1.4 |
| 9 | 98/2 | 1.5 |

As little as 2% LAB has a profound effect on blocking. There is relatively little additional improvement in blocking by increasing the LAB concentration in the blend above 2%. This is in agreement with the peel force results in which the relative surface energy rapidly drops off with LAB content up to about 10% LAB after which the relative surface energy doesn't decrease significantly up to 100% LAB.

Matchprint™ III constructions coated with the blends (including 100% ODA/MA/AN/AA LAB) gave fairly good image quality, i.e., able to hold a 2–3% dot on a 150 line/inch screen. The fact that 100% LAB functions at all when used as adhesive is quite unexpected given the low surface energy of the coated material. In order to function as an adhesive in color proofing elements, the LAB must adhere to the paper base after lamination, as well as to previously laminated color layers. In addition, there must be good adhesion between the LAB and the barrier layer. Poor adhesion results in poor image quality, specifically the inability of the proof to hold a small (2%) dot on a Ugra scale. Poor adhesion of either the adhesive to the base or to the barrier can cause the cross-linked dot to be mechanically removed by the developer brushes during development. The fact that one sees adhesion of 100% LAB to the base and barrier suggests that the surface composition of the LAB at these two interfaces is different (less LAB-like) than the LAB/air interface after coating and drying. In order to determine if this is true, 180° peel tests (with Magic™ tape) of the different 100% ODA/MA/AN/AA (51/11/25/13 parts by weight) LAB surfaces were measured. First, peel adhesion from the LAB as coated on PET was measured. Second, LAB was coated on color/barrier, laminated to base and the color/barrier processed off leaving the LAB surface that was formerly the LAB/barrier interface. Third, LAB was coated on base and then laminated to color/barrier. The color/barrier was processed off leaving the LAB surface. The peel force results are shown in Table 8.

TABLE 8

| Surface Tested (100% ODA/MA/AN/AA LAB) | 180° Peel Force (g/in.) (Magic ™ Tape) |
|---|---|
| 1. LAB surface after coating and drying on PET | 8.5 |
| 2. LAB surface after developing off-color barrier (formerly barrier/LAB interface) | 62 |
| 3. Same surface as (2) but LAB laminated to barrier instead of solution coating. | 63 |

From the peel force measurements, the relative surface energy of the LAB at the former LAB/barrier interface is 7 fold higher than the LAB/air interface of the LAB as coated. This result suggests higher concentration of ODA groups (specifically methyl groups) at the air interface during drying of the adhesive vs. at the LAB/barrier interface. The same results are found when the LAB is laminated to the color/barrier. In the case of method 3 the LAB surface prior to lamination has a low surface energy (peel force=8.5 g/in.). Upon lamination it appears the surface composition of the LAB changes; the LAB surface (after developing off color and barrier) has a much higher surface energy (peel force=63 g/in.). This example is used to illustrate what may be happening during lamination of the LAB to the base. It seems likely that upon lamination, the methyl groups of the octadecyl side chains which are originally at the surface migrate into the bulk of the adhesive leaving a higher energy surface allowing for better adhesion to the substrate.

EXAMPLE 13

Blends of a number of other acrylic and nonacrylic thermal adhesive polymers with ODA/MA/AN/AA LAB material (prepared in accordance with Example 4 and having a composition of 51/11/25/13 parts by weight, respectively) were prepared at blend ratios from 0–100% LAB and coated onto PET. Peel force measurements were performed on the coated films as described previously in Example 1. The thermal adhesive compositions are shown below in Table 9. The test results are shown in Tables 10–15.

In all cases one observed a non-linear relationship in peel force with LAB content. A rapid drop in peel force at low LAB levels was observed thereby suggesting migration of the LAB to the film surface as described in Example 12.

TABLE 9

| Table | Adhesive | Composition |
|---|---|---|
| 10 | WITCO 404 | Polyurethane Dispersion |
| 11 | ICI 440 | Polyurethane Dispersion |
| 12 | Eastman AQ29 | Polyester Dispersion |
| 13 | Unocal 917 | Polyvinylidene Chloride Latex |
| 14 | Unocal 7800 | Vinyl/Acrylic Latex |
| 15 | Reichhold 97603 | Acrylic Copolymer Latex |

TABLE 10

(WITCO 404/LAB Blend)

| Weight % LAB | 180° Peel Force (g/0.75 in.) |
|---|---|
| 0 | 117 |
| 1 | 89 |
| 2 | 54 |
| 5 | 14 |
| 10 | 10 |
| 25 | 11 |

TABLE 11

(ICI 440/LAB Blend)

| Weight % LAB | 180° Peel Force (g/0.75 in.) |
|---|---|
| 0 | 99 |
| 1 | 94 |
| 2 | 87 |
| 5 | 53 |
| 10 | 12 |
| 25 | 10 |

TABLE 12

(Eastman AQ29/LAB Blend)

| Weight % LAB | 180° Peel Force (g/0.75 in.) |
| --- | --- |
| 0 | 140 |
| 1 | 114 |
| 2 | 67 |
| 5 | 11 |
| 10 | 10 |
| 25 | 10 |

TABLE 13

(Unocal 917/LAB Blend)

| Weight % LAB | 180° Peel Force (g/0.75 in.) |
| --- | --- |
| 0 | 185 |
| 1 | 32 |
| 2 | 17 |
| 5 | 17 |
| 10 | 12 |
| 25 | 10 |

TABLE 14

(Unocal 7800/LAB Blend)

| Weight % LAB | 180° Peel Force (g/0.75 in.) |
| --- | --- |
| 0 | 85 |
| 1 | 72 |
| 2 | 50 |
| 5 | 42 |
| 10 | 33 |
| 25 | 20 |

TABLE 15

(Reichhold 97603/LAB Blend)

| Weight % LAB | 180° Peel Force (g/0.75 in.) |
| --- | --- |
| 0 | 55 |
| 1 | 60 |
| 2 | 44 |
| 5 | 49 |
| 10 | 40 |
| 25 | 24 |

EXAMPLE 14

Although an image is obtained when using LAB in the adhesive, there is a reduction in the exposure latitude with increasing amounts of LAB. "Exposure latitude" is defined as the exposure energy range within which one can hold a complete 2% dot and 98% screen on a 150 line/in. Ugra test target. At levels up to 5% LAB there is no decrease in the exposure latitude. Above this level, exposure latitude begins to drop off. At 20% LAB, exposure latitude is zero. At this level of LAB, one can still hold a 2% dot but it takes a longer exposure time to do it and by that time the 98% screen has become over-exposed. For a given exposure sufficient to hold a 2% dot for the standard adhesive (no LAB), the same exposure for a sample that contains 20% LAB in the adhesive shows that large pieces of the dot appear to be torn away during development (as observed by scanning electron microscopy). It appears dot loss is due to a lack of adhesion of the color/barrier to the adhesive. Thus, at LAB levels above about 10%, enough LAB is present at the barrier/adhesive interface to reduce adhesion of the image resulting in a decrease in exposure latitude although image loss is not catastrophic.

What is claimed is:

1. A coated substrate having a coating thereon which comprises a mixture of:
   a) a thermal adhesive having a glass transition temperature ranging from about −10° to about 60° C.; and b) a release agent selected from the group consisting of (1) copolymers having at least one vinyl polymeric segment and at least one siloxane polymeric segment and (2) copolymers derived from ethylenically-unsaturated fluoroalkyl-containing monomers.

2. The coated substrate of claim 1 wherein said thermal adhesive has a glass transition temperature ranging from about 20° to about 40° C.

3. The coated substrate of claim 2 wherein said thermal adhesive is selected from the group consisting of acrylic copolymers, vinyl/acrylic copolymers, polyvinylidene chloride copolymers, polyesters, polyurethanes, and rubber resins.

4. The coated substrate of claim 3 wherein said thermal adhesive is an acrylic copolymer.

5. The coated substrate of claim 1 wherein said release agent is present in said coating at a weight percentage ranging from 0.1 to 30.

6. The coated substrate of claim 5 wherein said release agent is present in said coating at a weight percentage ranging from 0.5 to 10.

7. The coated substrate of claim 1 wherein said coating further includes particulate matter.

8. A color proofing article comprising, in the following order:
   a) a carrier layer;
   b) a color layer; and
   c) an adhesive layer comprising a thermal adhesive and a release agent,
   wherein said thermal adhesive has a glass transition temperature ranging from about −10° to about 60° C. and said release agent is selected from the group consisting of (1) copolymers having at least one vinyl polymeric segment and at least one siloxane polymeric segment, and (2) copolymers derived from ethylenically-unsaturated fluoroalkyl-containing monomers.

9. The color proofing article of claim 8 wherein said adhesive has a glass transition temperature ranging from about 20° to about 40° C.

10. The color proofing article of claim 9 wherein said adhesive is selected from the group consisting of acrylic copolymers, vinyl/acrylic copolymers, polyvinylidene chloride copolymers, polyesters, polyurethanes, and rubber resins.

11. The color proofing article of claim 10 wherein adhesive is an acrylic copolymer.

12. The color proofing article of claim 8 wherein said release agent is present in said adhesive layer at a weight percentage ranging from 0.1 to 30.

13. The color proofing article of claim 12 wherein said release agent is present in said adhesive layer at a weight percentage ranging from 0.5 to 10.

14. The color proofing article of claim 8 wherein said adhesive layer further includes particulate matter.

15. The color proofing article of claim 8 wherein said adhesive layer has a dry coating weight ranging from 25 to 2000 mg/ft$^2$.

16. The color proofing article of claim 8 wherein said color layer is photosensitive.

17. The color proofing article of claim 16 further including a barrier layer positioned between said photosensitive color layer and said adhesive layer.

18. The color proofing article of claim 17 wherein said barrier layer is photosensitive.

19. The color proofing article of claim 18 wherein said photosensitive color and barrier layers comprise negative-acting photopolymerizable compositions.

20. The color proofing article of claim 18 wherein said photosensitive color and barrier layers comprise positive-acting photosensitive compositions.

21. The color proofing article of claim 16 further including a release layer positioned between said carrier layer and said photosensitive color layer.

22. The color proofing article of claim 8 further including a photosensitive sensitizer layer positioned between said color layer and said adhesive layer.

23. The color proofing article of claim 22 wherein said photosensitive sensitizer layer comprises a positive-acting composition.

24. The color proofing article of claim 22 wherein said photosensitive sensitizer layer comprises a negative-acting composition.

25. The color proofing article of claim 22 further including a release layer positioned between said carrier layer and said color layer.

26. The color proofing article of claim 22 further including a barrier layer positioned between said photosensitive sensitizer layer and said adhesive layer.

* * * * *